United States Patent
Kagan et al.

(10) Patent No.: US 7,132,678 B2
(45) Date of Patent: Nov. 7, 2006

(54) ELECTRONIC DEVICE INCLUDING A SELF-ASSEMBLED MONOLAYER, AND A METHOD OF FABRICATING THE SAME

(75) Inventors: Cherie Renee Kagan, Ossining, NY (US); Richard Martel, Peekskill, NY (US)

(73) Assignee: International Business Machines Corporation, Armonk, NY (US)

(*) Notice: Subject to any disclaimer, the term of this patent is extended or adjusted under 35 U.S.C. 154(b) by 129 days.

(21) Appl. No.: 10/392,983

(22) Filed: Mar. 21, 2003

(65) Prior Publication Data
US 2004/0185600 A1  Sep. 23, 2004

(51) Int. Cl.
H01L 29/08 (2006.01)
H01L 35/24 (2006.01)
H01L 51/00 (2006.01)

(52) U.S. Cl. ............... 257/40; 977/709; 977/731
(58) Field of Classification Search ......... 257/40; 977/731, 709
See application file for complete search history.

(56) References Cited

U.S. PATENT DOCUMENTS

| 5,017,975 | A | 5/1991 | Ogawa |
| 5,677,545 | A | 10/1997 | Shi et al. |
| 5,751,018 | A | 5/1998 | Alvisatos et al. |
| 6,646,285 | B1* | 11/2003 | Kagan et al. ............... 257/40 |
| 6,791,338 | B1* | 9/2004 | Bratkovski et al. ......... 324/600 |
| 6,949,762 | B1* | 9/2005 | Ong et al. ................... 257/40 |
| 2003/0111670 | A1* | 6/2003 | Misra et al. ................ 257/200 |
| 2004/0161873 | A1* | 8/2004 | Dimitrakopoulos et al. .. 438/99 |
| 2004/0191952 | A1* | 9/2004 | Shtein et al. ................ 438/99 |
| 2004/0263739 | A1* | 12/2004 | Sirringhaus et al. ........ 349/135 |

OTHER PUBLICATIONS

Ali Afzali-Ardakani, et al., "Conjugated Molecular Assembly, Method of Fabricating the Assembly and Device including the Assembly", U.S. Appl. No. 10/392,977, filed Mar. 21, 2003, pp. 1-41.
Ali Afzali-Ardakani, et al., "Solution Processed Pentacene-Acceptor Heterojunctions in Diodes, Photodiodes, and Photovoltaic Cells and Method of Making Same", U.S. Appl. No. 10/392,985, filed Mar. 21, 2003, pp. 1-28.
J. Collet et al., "Nano-Field Effect Transistor with an Organic Self-Assembled Monolayer as Gate Insulator", Applied Physics Letters, vol. 73, No. 18, Nov. 2, 1998.
J. Collet et al., "Low-Voltage, 30 nm Channel Length, Organic Transistors with a Self-Assembled Monolayer as Gate Insulating Films", Applied Physics Letters, vol. 76, No. 14, Apr. 3, 2000.
Colvin, V.L. "Semiconductor Nanocrystals Covalently Cound to Metal Surfaces with Self-Assembled Monolayers" Journal American Chemical Society 1992, vol. 114, pp. 5221-5230.
International Search Report (in International Application PCT/US2004/008401) dated Apr. 7, 2005.

* cited by examiner

*Primary Examiner*—W. David Coleman
(74) *Attorney, Agent, or Firm*—Ido Tuchman, Esq.; McGinn IP Law Group, PLLC

(57) ABSTRACT

An electronic device includes a source region and a drain region, a self-assembled monolayer disposed adjacent to the source region and the drain region, the self-assembled monolayer including at least one conjugated molecule, and a conductive substrate disposed adjacent to the self-assembled monolayer.

30 Claims, 6 Drawing Sheets

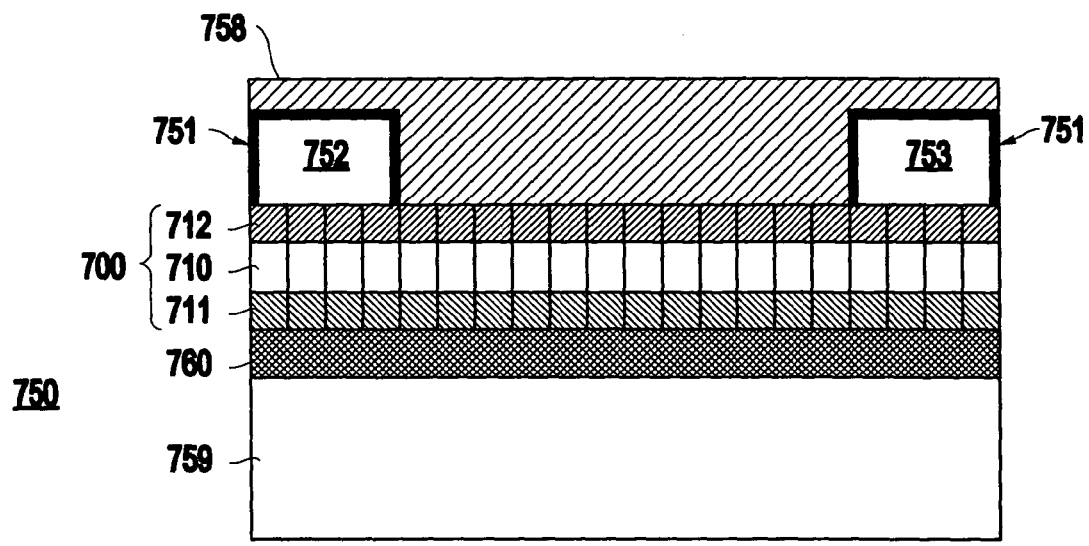
FIG.7
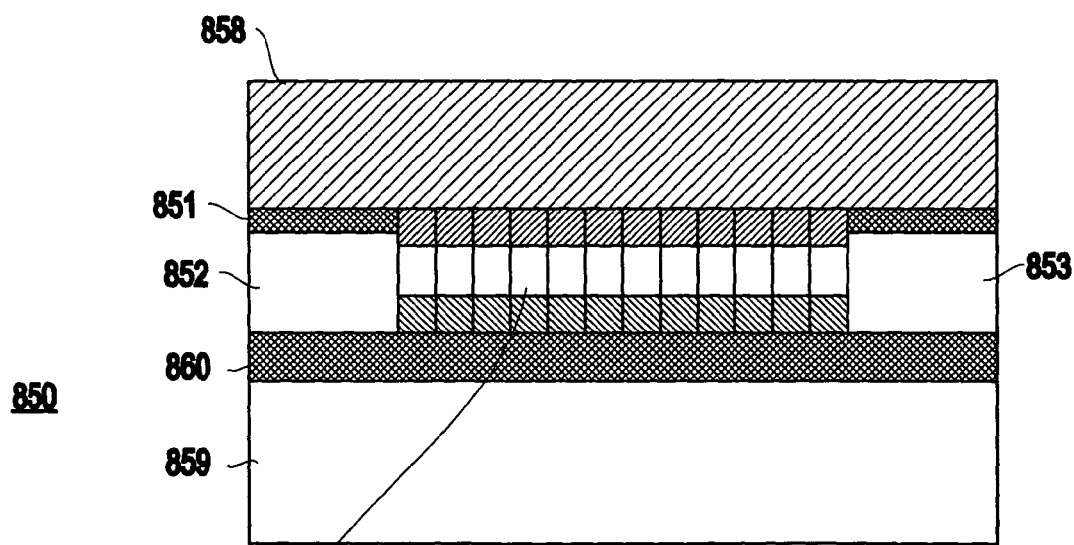
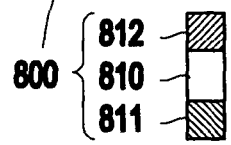
FIG.8

ELECTRONIC DEVICE INCLUDING A SELF-ASSEMBLED MONOLAYER, AND A METHOD OF FABRICATING THE SAME

CROSS REFERENCE TO RELATED APPLICATIONS

This Application is related to U.S. patent application Ser. No. 10/392,977 filed on Mar. 21, 2003, entitled "CONJUGATED MOLECULAR ASSEMBLY, METHOD OF FABRICATING THE ASSEMBLY, AND DEVICE INCLUDING THE ASSEMBLY", assigned to International Business Machines Corporation, and incorporated herein by reference.

BACKGROUND OF THE INVENTION

1. Field of the Invention

The present invention relates to an electronic (e.g. a molecular electronic) device including a self-assembled monolayer as the active material and, in particular, an electronic device having a self-assembled monolayer disposed adjacent to a conductive (e.g., metallic) substrate.

2. Description of the Related Art

Organic thin-film transistors (OTFTs) have continued to receive considerable attention as alternatives to traditional inorganic semiconductor transistors based on amorphous silicon channels. The structure of both commonly investigated bottom contact and top contact geometry OTFTs are shown in FIGS. 1B–1D. Progress in the preparation and fabrication of organic semiconductor materials and devices has enhanced the field-effect mobility of OTFTs to ~1 $cm^2$/V-sec, approaching the limit expected from the values found in single crystal organic solids.

In organic thin-films and crystals, the molecules or oligomers are held together by weak Van der Waals forces such that the $\pi$-orbitals on neighboring molecules overlap giving rise to charge transport in the solid state. Charge transport is, however, limited in organic solids by the weak intermolecular binding, giving rise to narrow valence and conduction bands, and by electron-phonon coupling.

Recently there has been research on fabricating OTFTs with narrow channels and also in replacing the commonly used gate insulating inorganic oxide or polymeric thin-films with an insulating, self-assembled monolayer (SAM) such as long chain, alkyltrichlorosilanes (J. Collet et al., "Nano-Field Effect Transistor with an Organic Self-Assembled Monolayer as Gate Insulator", Applied Physics Letters, Vol. 73, No. 18, Nov. 2, 1998; J. Collet et al., "Low-Voltage, 30 nm Channel Length, Organic Transistors with a Self-Assembled Monolayer as Gate Insulating Films", Applied Physics Letters, Vol. 76, No. 14, Apr. 3, 2000).

On the other hand, conjugated SAMs have received particular interest as active layers in molecular electronic and photonic devices. The conjugated SAMs that have been investigated are typically short (e.g., less than 4 nm) conjugated molecules. A molecule may also contain other groups or functionalities; the conjugated molecule being one segment of a larger molecule.

Molecular electronic and memory devices are based on intramolecular charge transport and building the desired functionality, such as switching, within the molecule. A molecular scale transistor is an important component for logic applications and has often been referred to as the "holy grail" of molecular electronics.

However, it is desired to improve the performance of conventional molecular devices. Specifically, it is desired to provide an electronic device having a molecular layer (e.g., self-assembled monolayer) with improved electrical properties.

SUMMARY OF THE INVENTION

In view of the foregoing and other problems, disadvantages, and drawbacks of the conventional systems and methods, it is a purpose of the present invention to provide an electronic device having a molecular layer with improved electrical properties.

The present invention includes an electronic device (e.g., a field-effect transistor) which includes a source region and a drain region, a self-assembled monolayer disposed adjacent to the source region and the drain region, the self-assembled monolayer including at least one conjugated molecule, and a conductive substrate (e.g., metal substrate) disposed adjacent to the self-assembled monolayer. For example, the at least one conjugated molecule may include at least one of a oligophenylacetylene, a polyacene, an oligothiophene, an oligophenylene, an oligophenylene vinylene, and a porphyrin-derivative.

Specifically, the self-assembled monolayer may include the active channel layer of the transistor. In that case, carriers may be injected into the self-assembled monolayer and propagate along a plane disposed by the self-assembled monolayer. For example, the self-assembled monolayer may include an active layer responsible for current modulation and charge transport at the interface with an insulator.

The self-assembled monolayer may also include a functional group which helps assemble the molecules to form the self-assembled monolayer on the substrate in a well-ordered manner.

The electronic device may also include a gate electrode disposed adjacent to the self-assembled monolayer. Further, the gate electrode may be the same layer as the conductive substrate. Further, the substrate may control the electrostatic function of the channel layer, and at least one of the gate electrode and the substrate may be isolated electrically from the self-assembled monolayer.

In addition, the at least one conjugated molecule may include a plurality of molecules which are selected to increase the $\pi$-overlap between molecules in the channel layer. Further, the plurality of molecules may be aligned and packed together to form the self-assembled monolayer (e.g., a two dimensional layer).

Further, the self-assembled monolayer may also include a functional group to reduce electrical conduction between the $\pi$-electron system of the self-assembled monolayer and an adjacent conductive layer. In addition, the self-assembled monolayer may include a functional group which provides an electrical contact between the self-assembled layer and the source and the drain regions.

In addition, the self-assembled monolayer may include a first functional group for attaching to the substrate, and a second functional group which increases the electrical isolation between the self-assembled monolayer and an adjacent layer. Further, the first group may include at least one of phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithiocarboxylate, xanthate, thioxanthate, alkylthiophosphate, dialkyldithiophosphate, and any combination of these groups.

The second functional group has insulating character for example an alkyl chain.

The source and drain regions may include a metal contact. The source and drain regions may be disposed, for example, on a top surface of the self-assembled monolayer. The source and drain regions may each be disposed on a side of the self-assembled monolayer. Further, the conductive substrate may be disposed on a top surface of the self-assembled monolayer.

Alternatively, one of the source and drain regions may be disposed on a side of the self-assembled monolayer, and another of the source and drain regions may be disposed on a top of the self-assembled monolayer. In addition, one of the source and drain regions may be disposed on a bottom and side of the self-assembled monolayer, and another of the source and drain regions may be disposed on a top and side of the self-assembled monolayer.

The present invention also includes an inventive method of fabricating an electronic device. The inventive method includes forming a source region and a drain region, forming a self-assembled monolayer adjacent to the source region and drain region, the self-assembled monolayer including least one conjugated molecule, and forming a conductive substrate adjacent to the self-assembled monolayer.

With its unique and novel features, the present invention provides an electronic device (and method of fabricating the electronic device) having a molecular layer (e.g., self-assembled monolayer) with improved electrical properties. Specifically, the inventive electronic device provides better performance than a conventional organic thin-film transistor.

BRIEF DESCRIPTION OF THE DRAWINGS

The foregoing and other objects, aspects and advantages will be better understood from the following detailed description of preferred embodiments of the invention with reference to the drawings, in which:

FIG. 7 illustrates an electronic device 750 having two top contacts and a top metal substrate according to the present invention;

FIG. 8 illustrates an electronic device 850 having a top metal substrate and two side contacts according to the present invention;

DETAILED DESCRIPTION OF THE PREFERRED EMBODIMENTS OF THE INVENTION

Figure 4:
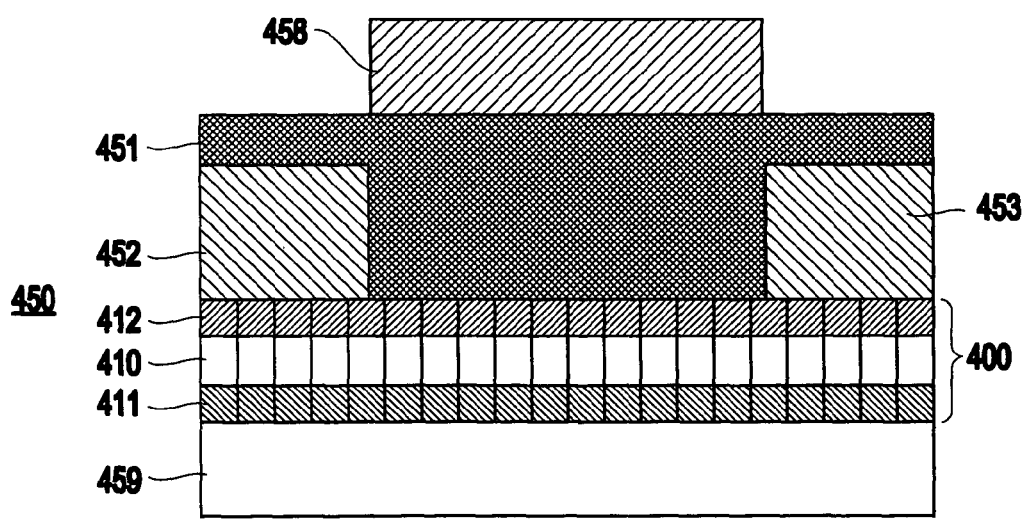
FIG. 4 illustrates an electronic device 450 having two top contacts according to the present invention.
Figure 5:
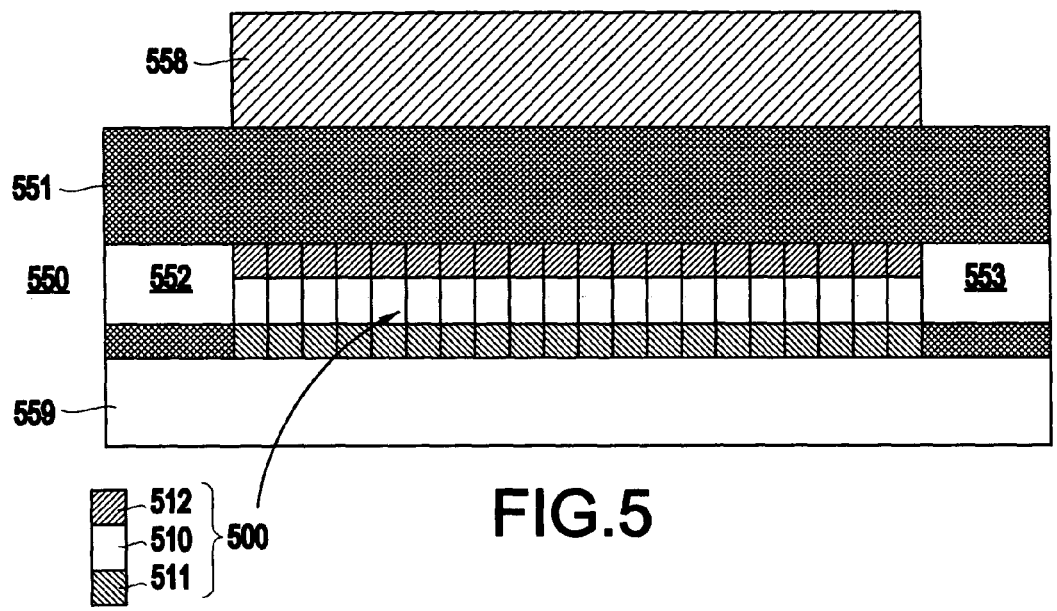
FIG. 5 illustrates an electronic device 550 having side contacts according to the present invention.

Referring now to the drawings, FIG. 4 illustrates an example of an electronic (e.g., molecular electronic) device according to the present invention. Specifically, the electronic device 400 illustrated in FIG. 4 includes a source region 452 and a drain region 453, a self-assembled monolayer 400 disposed adjacent to the source region and the drain region, the self-assembled monolayer including at least one conjugated molecule 410, and a conductive (e.g., metallic) substrate 459 adjacent to the self-assembled monolayer.

In general, the present invention includes a field effect transistor which may include a self-assembled molecular monolayer or multilayer (SAM) on or in proximity to a conductive (e.g, metal) substrate. The SAM layer may be used as the active semiconductor channel. Carriers that are injected into the SAM will propagate along the plane disposed by the SAM.

The present invention is distinct from conventional organic thin-film transistors (OTFTs) (e.g., see G. Horowitz, "Organic Field-Effect Transistors," Adv. Mater. 10, 365 (1998); "Organic Electronics," IBM Journal of Research and development, vol. 45(1), 2001) in at least the following respects:

1) Although the conductive channel in conventional OTFTs involves a conjugated π-electron system, the conductive channel material for the present invention is different, specifically in the physical properties created by the geometries of the present invention.

In particular, the channel in the present invention includes a SAM layer (e.g., a molecular layer self-assembled on or in proximity to a conductive (e.g., metal) surface). The electrical properties of the SAM layer are significantly improved once assembled on the metal substrate. There is evidence that a SAM based FET provides better performance than a conventional organic thin-film transistor;

2) In the present invention, the gate electrode may be placed in proximity to the SAM in the plane (parallel or tilted) to the molecular film and the metal substrate. The gate can also be the metal substrate itself. In that case, the function of the substrate is to assemble the SAM layer and control the electrostatics of the semiconducting FET channel;

3) In the present invention, the source-drain electrodes may be contacted directly to the π-electron system of the SAM layer. However, the gate and (or) the metal substrate may be isolated electrically from the π-electron SAM layer. That is, the SAM layer (e.g., the molecules forming the SAM layer) may have multiple functionalities including, for example, a) It may be designed to have a conjugated part which maximizes the π-overlap between molecules in the thin-film;

b) It may have a functional group to help assemble the molecule on a surface (e.g., a metal surface or substrate) in a well-ordered manner. For instance, several aligned 1D (one dimensional) structures (e.g., organic molecules) may be packed together to form a 2D (two dimensional) structure (e.g., a layer);

c) It may include another chemical group (or a pendant segment attached to the end group used for self-assembly) to reduce the electrical conduction between the π-electron system and the support metal (e.g., the gating region). However, it is possible that the end group for self-assembly may sufficiently insulate the system from the support metal.

d) It may include another functional group which allows electrical contact to the π-electron SAM layer by the source and the drain electrodes. This group may also be designed to control the orientation which may improve the device characteristics.

The self-assembled monolayer (SAM) may include a monolayer (or multilayer) of molecules containing a conjugated segment (e.g. benzyl ring) packed together and assembled on or in proximity to a conductive substrate (e.g. a metal such as gold).

4) The SAM layer may also confine charge transport in the active layer to two-dimensions. The reduced dimensionality and the geometry enhance the electrostatics governing the operation of the device including injection from the source and drain electrodes.

Properties of the Molecules without the Substrate

Figure 1:
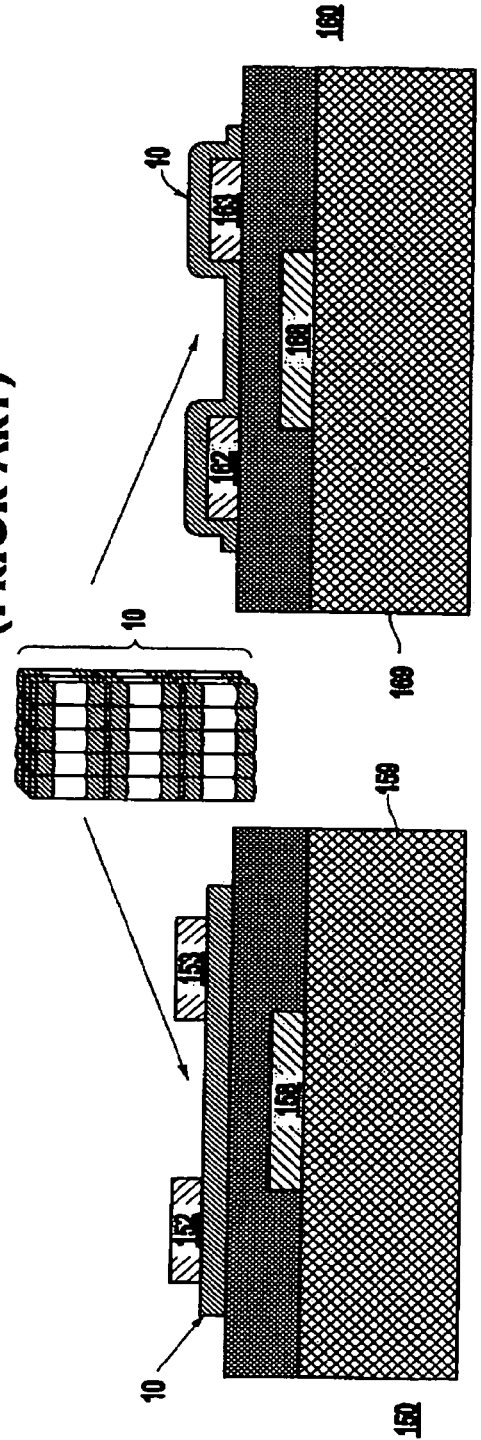
FIG. 1A illustrates a molecular layer 10.
FIGS. 1B–1D illustrate devices 150, 160, 170 having molecular layers without an adjacent conductive substrate.

FIG. 1A illustrates a molecular layer 10, and FIGS. 1B–1D illustrate devices 150, 160, 170 which do not have a conductive substrate disposed adjacent to the self-assembled monolayer.

The isolated conjugated molecule has a large band-gap. In the organic solid state, as a thin-film or single crystal, charge transport arises from π-orbital overlap between adjacent conjugated molecules, forming narrower "bands" or states. At room temperature charge transport arises from intermolecular hopping and, therefore, thin-film and single crystal organic FETs present lower carrier mobilities that are at best ~1–10 $cm^2$/V-sec. [G. Horowitz, "Organic Field-Effect Transistors," Adv. Mater. 10, 365 (1998); "Organic Electronics," IBM Journal of Research and development, vol. 45(1), 2001].

For example, FIG. 1A illustrates a molecular layer 10 (e.g., a deposited molecular layer) which includes at least one conjugated molecule. In addition, the molecular layer 10 may also include a head end group (e.g., for attaching to a substrate) and a tail end group (e.g., for attaching to another molecule or layer) attached to the conjugated molecule.

FIG. 1B illustrates a top-contact thin-film transistor 150 in which the molecular layer 10 is disposed on the gate insulation 151 and the source and drain regions 152, 153 are disposed on the molecular layer 10. The gate insulator 151 is deposited or grown on a gate electrode 158 which may be deposited on or is the substrate 159. FIG. 1C illustrates a bottom-contact thin-film transistor 160 in which the source and drain regions 162, 163 are disposed on the gate insulating film 161 and the molecular layer 10 is disposed on the source and drain regions 162, 163 and gate insulating film 161. The gate insulator 161 is deposited or grown on a gate electrode 168 which may be deposited on or is the substrate 169. FIG. 1D illustrates a single-crystal field-effect transistor 170 (e.g., having a gate 174) in which the molecular layer 10 is disposed beneath the gate insulating film 171 and the source and drain regions 172, 173.

In each of these structures, the active layer responsible for current modulation and charge transport is the molecular layer 10, specifically the portion of the molecular layer 10 which is located at the interface with an insulator (the molecule-insulator interface in closest proximity to the gate electrode).

Role of the Substrate and Formation of the SAM

The molecules in the molecular layer are attached (e.g., chemically bonded or adsorbed) on or in proximity to a surface of a conductive (e.g., metal) substrate. The substrate is the template on which the molecular layer is assembled to form an ordered structure. Moreover, there is evidence that the substrate (e.g., the proximal metal surface) improves the electrical properties of the π-system and modifies the bands to favor better conduction and modulation with the gate field.

As in the organic thin-film, the SAM layer also involves stronger π-overlap between the assembled molecules. However, the electronic states in the SAM film are improved because of the presence of the conductive (e.g., metal) substrate. This improvement occurs mainly because the molecules are better aligned and form broader states because of the electronic interaction with the conductive substrate.

Moreover, the molecular layer includes a SAM layer which is a monolayer (e.g., a thin channel for charge transport). The electronic states of this layer are, therefore, better confined within the plane of the film. The molecular layer (e.g., deposited molecular layer) may be thicker than a single monolayer, but only the layer of molecules adjacent to the surface of the substrate (e.g., metal substrate) is electronically broadened and only the layer of molecules adjacent to the gate insulator is modulated by the gate field.

Structure of the SAM

The π-system of the SAM may be electrically isolated from the substrate using a chemical group or a buffer layer. For example, a thiol group is known to form a barrier for transport (M. A. Reed et al. Conductance of a Molecular Junction," Science 278, 252 (1997); M. Diventra et al. 'First-Principles Calculation of Transport Properties of a Molecular Device", Phys. Rev. Lett. 84, 979 (2000)). Such a barrier may help to further confine the π-electrons and isolate the conducting channel from the substrate (e.g., gold (metal) substrate). This confinement may be operational to reducing short-channel behavior and to improve charge injection through the contact barriers.

Figure 2:
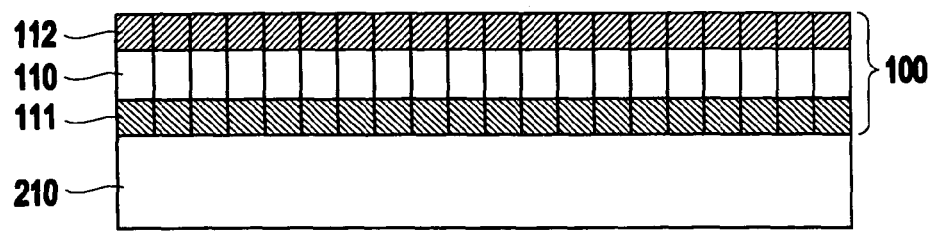
FIG. 2 illustrates an example of a molecular layer 100 adjacent to a metal substrate.

The molecular layer 100 (e.g., a semiconducting molecular film) may have a generic structure illustrated, for example, in FIG. 2. As shown in FIG. 2, a generic SAM layer 100 including a conjugated molecule 110 (e.g., a π-molecular system) having a head end 111 and tail end 112 attached thereto, may be disposed on a substrate 210. In FIG. 2, the substrate 210 is a metal substrate, although other conductive substrates are possible.

Figure 3:
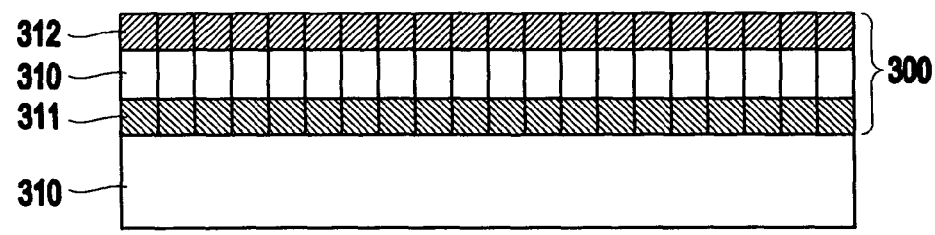
FIG. 3 illustrates a specific example of a molecular layer 300 adjacent to a gold substrate.

FIG. 3 illustrates a specific example of a SAM layer 300 for a π-molecular system. In this example, the SAM layer 300 is disposed of di-thiol molecules. Specifically, the SAM layer 300 includes a conjugated molecule 310 (e.g., π-molecular 1D or 2D system), a head end thiol molecule 311 and a tail end thiol molecule 312 bound to the conjugated molecule 310. The SAM layer 300 may be assembled on a substrate 310 (e.g., gold substrate).

In this example, the gold substrate can be replaced by any conductive film or functionalized metal or metal with a thin oxide layer or other supports including highly doped semiconductors. Also, the head of the molecule can be made of any chemical group that helps to self-assemble chemically the individual molecules on those substrates.

The SAM layer may be disposed in the manner described in the above-referenced related patent application (e.g., U.S. patent application Ser. No. 10/392,977, entitled "CONJUGATED MOLECULAR ASSEMBLY, METHOD OF FABRICATING THE ASSEMBLY, AND DEVICE INCLUDING THE ASSEMBLY", assigned to International Business Machines Corporation, and (in combination with the conductive substrate on which it is disposed) may have a structure which is similar to the conjugated molecular assembly which is described in detail in the above-referenced related patent application.

More specifically, the molecules forming the SAM may have the same end groups (e.g., the head group is the same as the tail group) or two different functional end groups (head and tail are different). One end group (termed "head" group) is chosen to attach (e.g., bind or adsorb) to the desired substrate surface. The head group may also provide electrical isolation between the substrate and the π-conjugated layer disposed by the SAM. The other end group (termed "tail" group) may be chosen to form an electrical contact and reduce the resistance to the source and drain electrodes.

The "head" end group, for example, for metal and semiconductor surfaces may be selected from functional groups including thiol/thiolate, amine, imine, nitrile, isocyanide, phosphine, selenide, and sulfide. For an oxide surface, for example, the head end functional group may include a silane, phosphonic acid, hydroxamic acid, and hydroxilic acid functional group. This list is not exhaustive and is not intended to be limiting.

The end functional group (e.g., head end group and/or tail end group) may also be chosen to contain a spacer group, such as an alkyl chain, to increase the electrical isolation between another layer (e.g., the substrate or a layer disposed on the SAM layer) and the SAM layer (e.g., the π-molecular layer).

The "tail" end group may be selected from the same groups listed above with respect to the head end group. Further, the tail end group may have the same or a different functionality as the "head" group, and may be selected to control the SAM layer-to-metal contact (e.g., the contact between the molecular layer and a source or drain disposed on the molecular layer). For example, isocyanides have been shown to provide lower resistance metal-to-molecule contacts (J. Chen, L. C. Calvet, and M. A. Reed, D. W. Carr, D. S. Grubisha and D. W. Bennett, "Electronic Transport Through Metal—1, 4, phenylene diisocyanide-metal Junctions", Chem. Phys. Lett., 313, 741 (1999)).

Structures of the SAMFETs

FIGS. 4–9 illustrate examples of a SAMFET according to the present invention. For example, as shown in these figures, the SAMFET may include a source electrode and a drain electrode (e.g., metal contacts) which contact either the top or the sides of the molecular π-layer (e.g., SAM layer). Most of the molecular π-layer (e.g., SAM film) should be exposed to the gate field (e.g., in proximity to the gate electrode) so that the gating of the structure is improved.

For example, FIG. 4 illustrates a SAMFET structure in which the SAMFET 450 includes two top contacts (e.g., a source electrode 452 and a drain electrode 453). Specifically, the SAM layer 400 includes a conjugated molecule 410 (e.g., π-molecular layer) and a head end functional group 411 and tail end functional group 412, and is disposed on a conductive (e.g., metal) substrate 459. The SAMFET 450 also includes a dielectric (e.g., insulating) layer 451 and a gate (e.g., metal gate) 458 disposed on the dielectric layer 451.

However, other contact schemes can yield alternative injection into the molecular SAM. This is shown, for example, in FIG. 5 which illustrates a SAMFET 550 having side contacts (e.g., a source electrode 552 and a drain electrode 553) which may be metal. Specifically, the SAM layer 500 includes a conjugated molecule 510 [e.g., π-molecular (1D or 2D layer)] and a head end functional group 511 and tail end functional group 512, and is disposed on a conductive (e.g., metal) substrate 559. The SAMFET 550 also includes a dielectric (e.g., insulating) layer 551 and a gate (e.g., metal gate) 558 disposed on the dielectric layer 551.

Figure 6:
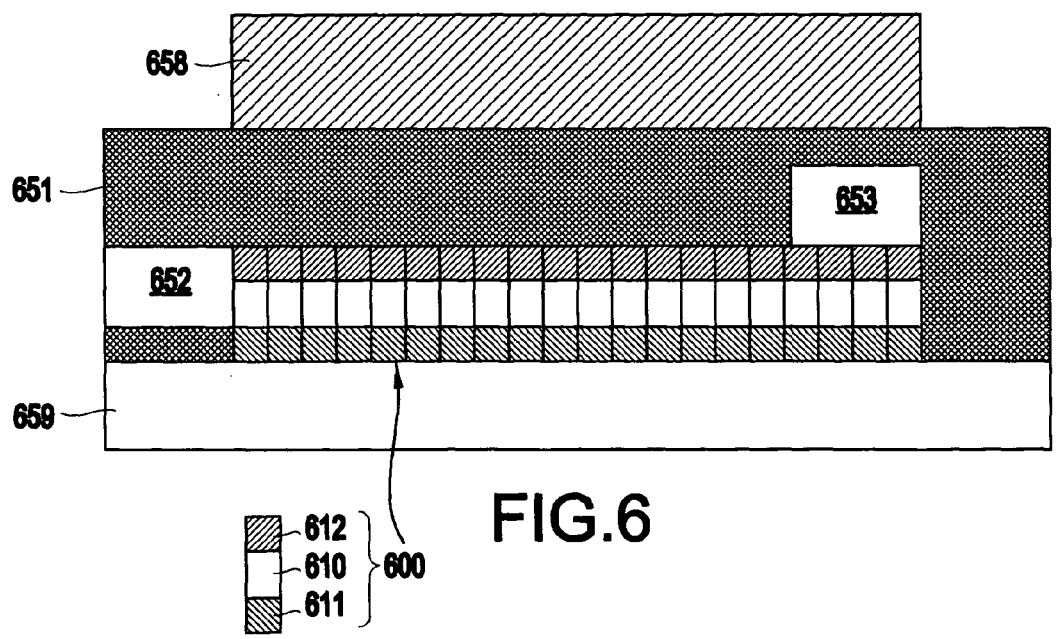
FIG. 6 illustrates an electronic device 650 having a side contact and a top contact according to the present invention.

Further, FIG. 6 illustrates a SAMFET 650 having a side and a top contact (e.g., a source electrode 652 and a drain electrode 653, respectively) which may be metal. Specifically, the SAM layer 600 includes a conjugated molecule 610 (e.g., π-molecular (e.g., 2D) layer) and a head end functional group (e.g., thiol group) 611 and a tail end functional group (e.g., thiol group) 612, and is disposed on a conductive (e.g., metal) substrate 659. The SAMFET 650 also includes a dielectric (e.g., insulating) layer 651 (e.g., oxide) and a gate (e.g., metal gate) 658 disposed on the dielectric layer 651.

FIG. 7 illustrates another possible example of a SAMFET structure according to the present invention. For example, in FIG. 7 illustrates a SAMFET 750 having a source 752 and drain 753 disposed on top of the SAM layer 700. Specifically, the SAM layer 700 includes a conjugated molecule 710 (e.g., π-molecular layer) and a head end functional group 711 and a tail end functional group 712, and is disposed on an insulating layer (e.g., silicon dioxide) 760 which is disposed on a substrate (e.g., silicon substrate) 759. The SAMFET 750 also includes a dielectric (e.g., insulating) layer 751 and a metal layer 758 disposed on the SAM layer 700.

FIG. 8 shows a SAMFET which is similar to that illustrated in FIG. 7. However, in FIG. 8, the SAMFET has a source and a drain disposed on a side of a SAM layer. Specifically, the SAMFET 850 includes a source electrode 852 and a drain electrode 853. The SAM layer 800 includes a conjugated molecule 810 (e.g., π-molecular layer) and a head end functional group 811 and a tail end functional group 812, and is disposed on an insulating layer (e.g., silicon dioxide) 860 which is disposed on a substrate (e.g., silicon substrate) 859. The SAMFET 850 also includes a dielectric (e.g., insulating) layer 851 and a gate (e.g., metal gate) 858 disposed on the dielectric layer 851 and the SAM layer 800.

Figure 9:
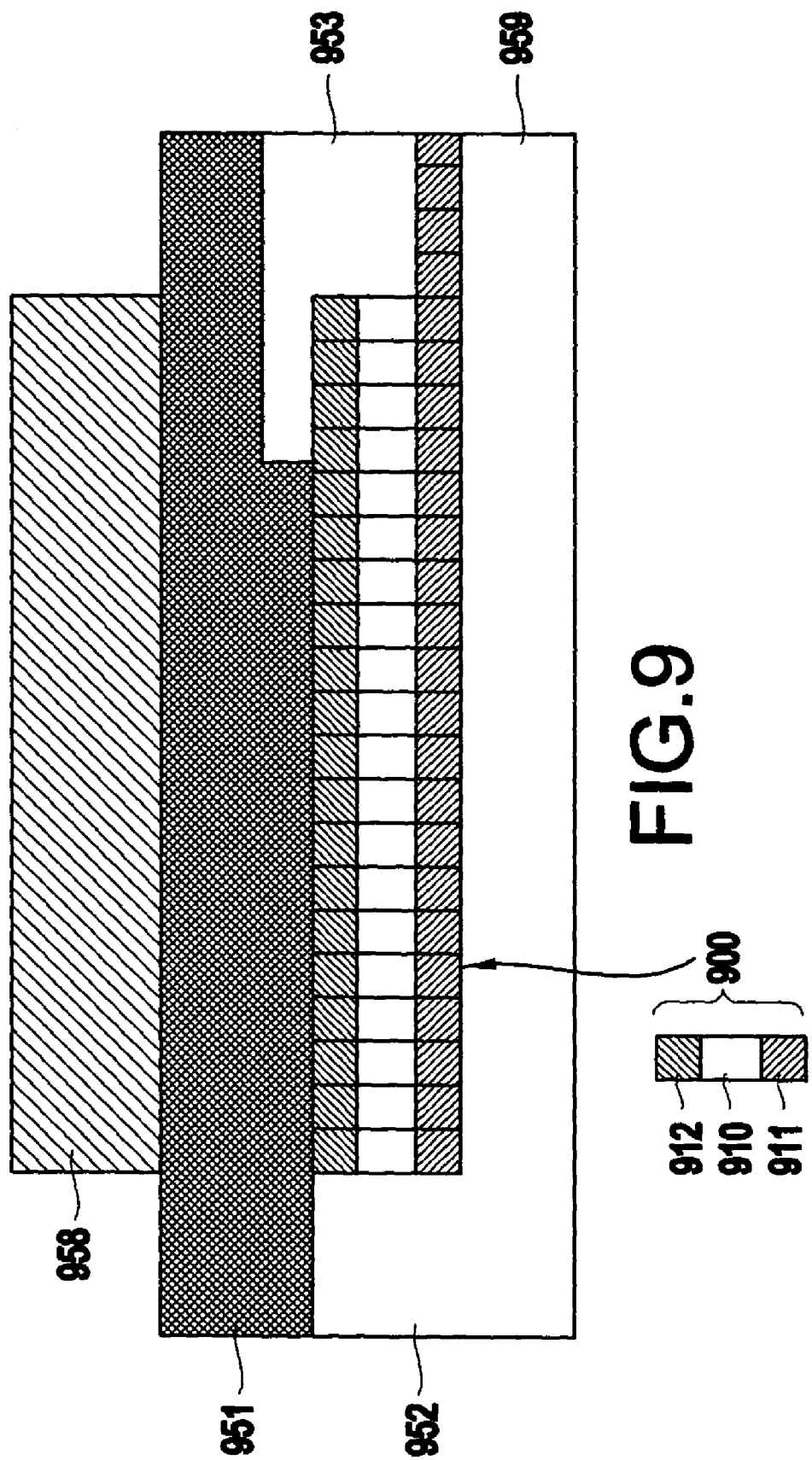
FIG. 9 illustrates an electronic device 950 having a side/bottom contact and a top/side contact according to the present invention.

In FIG. 9, the SAMFET 950 has a source disposed on a side and the bottom of a SAM layer, and a drain disposed on a side of the SAM layer. Specifically, the SAMFET 950 includes a source electrode 952 and a drain electrode 953. The SAM layer 900 includes a conjugated molecule 910 (e.g., π-molecular (1D or 2D) layer) and a head end functional group 911 and a tail end functional group 912, and is disposed on a substrate (e.g., metal substrate) 959. The SAMFET 950 also includes a dielectric (e.g., insulating) layer 951 and a gate (e.g., metal gate) 958 disposed on the dielectric layer 951.

However, in this structure (e.g., as shown in FIG. 9), it may be advantageous that tunneling and other forms of parasitic conduction are reduced or even suppressed in the OFF state of the device. Indeed, there is a region where the source and the drain electrodes 952, 953 are in very proximity (about the thickness of the molecular film) with each other or with the substrate 959 (e.g., metal substrate). The head group 911 should, therefore, be designed to introduce a higher resistance in these regions.

Gate Electrode

In the above-referenced structures (e.g., as illustrated in FIGS. 4–9), the gate electrode may be separated from the source and drain regions by a dielectric layer. In addition, the electric field may be applied perpendicular to the plane disposed by the SAM layer. For example, the dielectric layer can be made of silicon oxide, metal oxides, organic films or other dielectric layer materials. The geometry of the gate should be chosen to get an effective modulation of the conduction in the molecular layer.

The present invention solves the problems discussed above with respect to the conventional devices. Specifically, the invention achieves an advantage over the conventional devices by providing a molecular FET structure that is less expensive to fabricate and assemble on a substrate.

The performance of such a molecular FET will be superior to any other molecular devices because of at least the placement of a conductive surface in proximity to the molecular channel, the more efficient injection into the molecules, the better confinement of the electron gas in the channel layer, and the more effective gating from an electrostatic field. Further, the invention may be utilized, for example, in either logic or memory devices.

Further, in each of the structures according to the present invention, the active layer responsible for current modulation and charge transport is a molecular layer (e.g, a SAM layer) at the interface with an insulator (the molecule-insulator interface in closest proximity to the gate electrode). Once assembled in proximity to a metal surface, the molecules form an ordered 1D (one dimensional) or 2D (two dimensional) molecular layer involving π-overlap between the assembled conjugated molecules. This molecular layer may be physically adsorbed or chemically bound to the surface (metal or metal oxide) or in proximity to the surface.

For example, a physically adsorbed molecular layer (e.g., SAM layer) may include a conjugated molecule including, for example, oligophenylacetylene, polyacenes (such as pentacene), oligothiophenes (such as sexithiophene), and porphyrin-derivatives (such as phthalocyanines). The molecular layer may be deposited from solution or from the vapor phase to form such molecular layers with π-overlap between the conjugated molecules.

The π-π interaction between conjugated molecules helps to drive the assembly of these systems and may orient the molecules standing up from the substrate surface. Further, the ends of these conjugated molecules may be functionalized with insulating spacers, such as an alkyl chain, to tune the electrical resistance of the molecule from electrodes.

Examples of the conjugated segment (e.g., the conjugated molecule(s) in a SAM layer) include molecules having the following structural formulations:

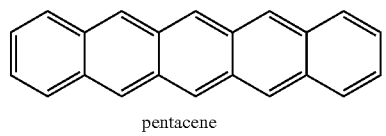

pentacene

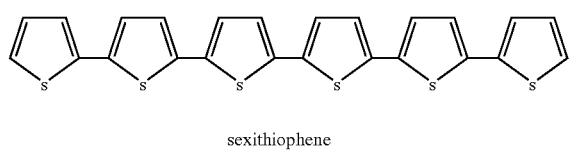

sexithiophene

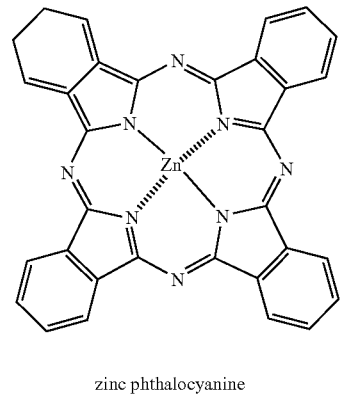

zinc phthalocyanine

The SAM layer may also be chemically bound to the substrate (e.g., adjacent to the substrate). Synthetic chemistry also provides the flexibility to build different functionalities into the conjugated molecules of the molecular layer. For example, the molecules may be designed to form self-assembled monolayers of conjugated molecules with π-overlap between the conjugated molecules.

In addition, the molecules may be functionalized with head groups that bind to a particular material which may include a metallic, semiconducting, or insulating surface to facilitate self-assembly of the molecular layer. This is illustrated, for example, in FIGS. 10A–10C.

Figures 10A, 10B, 10C:
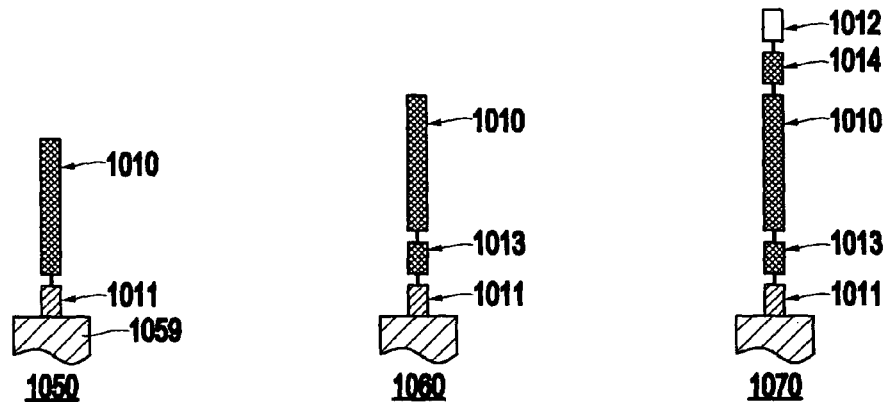
FIGS. 10A–10C illustrate how a conjugated molecule 1010 may be functionalized with a head group 1011, a tail group 1012, and insulating groups 1012, 1014 according to the present invention.

For example, FIG. 10A illustrates a system 1050 which includes a substrate 1059, and a conjugated molecule 1010 having a head end functional group 1011 for attaching the conjugated molecule 1010 to the substrate 1059. The system 1060 in FIG. 10B is similar that in FIG. 10A. However, the system 1060 includes an insulating functional group 1013 between the head end functional group 1011 and the conjugated molecule 1010. Further, the system 1070 in FIG. 10C is similar to that in FIG. 10B. However, the system 1070 includes a tail end functional group 1012 on the conjugated molecule 1010, and a second insulating functional group 1014 which is disposed between the tail end functional group 1012 and the conjugated molecule 1010.

Examples of the head end functional group that can be used (e.g, attached to the conjugated molecules) for interacting with or binding to a particular substrate surface with chemical specificity, include one or more of the same or different functional groups, such as phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithiocarboxylate, xanthate, thioxanthate, alkylthiophosphate, dialkyldithiophosphate, phosphonic acid, hydroxamic acid or a combination of any of these groups. For example, in the SAM layer 300 of FIG. 3, the head end functional group 311 and the tail end functional group 312 both include a thiol functional group.

Conjugated segments may be directly bound to the functionalized head group or may be spaced by an insulating segment to achieve the desired device structure and characteristics. The insulating segment may, for example, be incorporated to improve/tune the electrical isolation of the conjugated segment from the metal substrate and it may be chosen to act as a gate dielectric.

For example, the insulating segment may be a simple alkyl chain. The conjugated segments may be from the examples above (e.g., acenes, thiophenes, phenylenes, phenylene vinylenes, porphyrin-derivatives) or those within in the art. The π-conjugated segment may also be functionalized with an insulating spacer and with a tail end functional group. For example, the tail end functional group may be used to provide contact to a metal layer deposited on top of the molecular layer. The list of example tail end group functionalities is the same as that set forth above for the head functionalities.

Fabrication for SAMFET Structures

Figure 11:
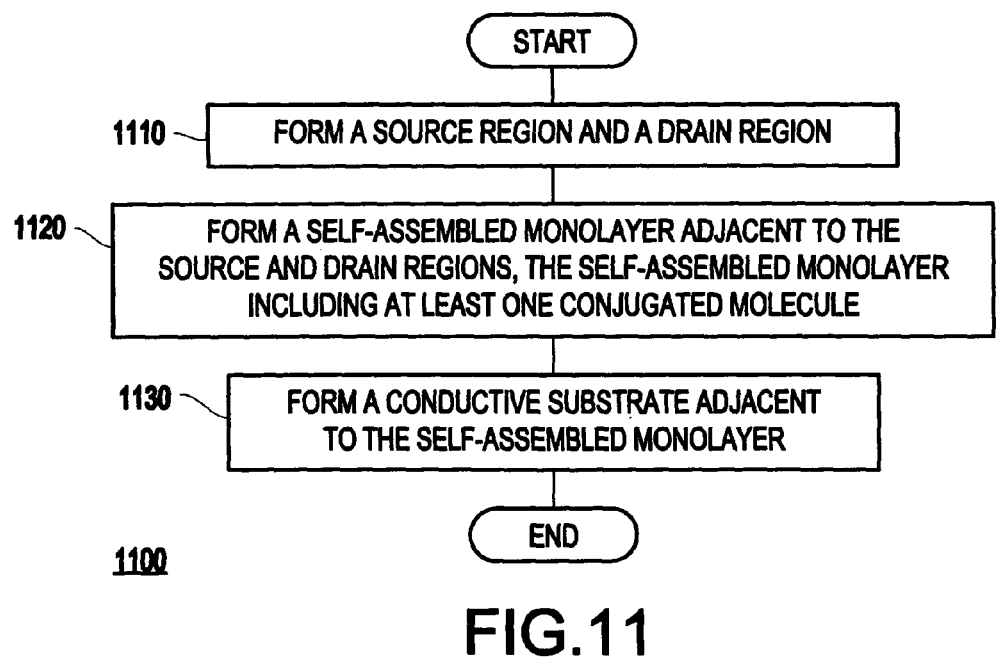
FIG. 11 illustrates a method 1100 of fabricating an electronic device according to the present invention.

As illustrated in FIG. 11, the present invention also includes an inventive method 1100 of fabricating an electronic device (e.g. a field-effect transistor) including a self-assembled monolayer (SAMFET). The inventive method 1100 includes forming (1110) a source region and a drain region, forming (1120) a self-assembled monolayer adjacent to the source region and drain region, the self-assembled monolayer including least one conjugated molecule, and forming (1130) a conductive substrate adjacent to the self-assembled monolayer.

For example, the inventive method 1100 may be used to fabricate a SAMFET having two top contacts as illustrated in FIG. 4. Specifically, in this example of the inventive method 1100, an insulating layer (e.g. Si oxide on a Si wafer) may be grown on a flat substrate. A gold film is deposited on the insulating layer (using a standard adhesion layer such as Ti). The gold film is patterned using lithography. The gold layer is cleaned and the active molecules are deposited using a molecular self-assembly technique as discussed above.

The top metal layer may then be deposited (e.g., by evaporation) onto the molecular layer (e.g., the SAM layer) through a stencil mask or using lithography. This metal layer will form the source and the drain of the SAM layer transistor. The layer can also be grown using electroplating.

An insulating layer is deposited using a CVD technique or another technique including self-assembly, then the gate metal is deposited (or the gate layer is deposited through a stencil mask and then the contact are opened using lithography and etching). The gate metal is patterned using optical lithography, the gate layer is etched, and the contacts are opened using lithography and etching.

With its unique and novel features, the present invention provides an electronic device (and method of fabricating the electronic device) having a molecular layer (e.g., self-assembled monolayer) with improved electrical properties. Specifically, the inventive electronic device provides better performance than a conventional organic thin-film transistor.

While the invention has been described in terms of preferred embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. An electronic device comprising:
   a source region and a drain region;
   a self-assembled monolayer disposed adjacent to the source region and the drain region and comprising a conjugated molecule; and
   a conductive layer in electronic interaction with the self-assembled monolayer for broadening an electronic state of said conjugated molecule.

2. The electronic device according to claim 1, wherein said conductive layer comprises a metal substrate.

3. The electronic device according to claim 1, wherein said self-assembled monolayer comprises a channel layer, and
   wherein carriers, upon being injected into said self-assembled monolayer, propagate along a plane disposed by said self-assembled monolayer.

4. The electronic device according to claim 1, wherein said self-assembled monolayer further comprises a functional group which helps assemble molecules in said self-assembled monolayer on said conductive layer in an ordered manner.

5. The electronic device according to claim 1, further comprising:
   a gate electrode formed on said self-assembled monolayer.

6. The electronic device according to claim 1, wherein said conjugated molecule comprises a plurality of molecules which are selected to increase a n-overlap between molecules in said self-assembled n-monolayer.

7. The electronic device according to claim 1, wherein said self-assembled monolayer further comprises a functional group to reduce electrical conduction between a n-electron system of said self-assembled monolayer and an adjacent conductive layer.

8. The electronic device according to claim 1, wherein said self-assembled monolayer further comprises a functional group which provides an electrical contact to said self-assembled layer by said source and drain regions.

9. The electronic device according to claim 1, wherein said self-assembled monolayer further comprises a first functional group for attaching to said conductive layer.

10. The electronic device according to claim 1, wherein said electronic device comprises a field-effect transistor.

11. The electronic device according to claim 1, wherein each of said source and drain regions comprises a metal contact.

12. The electronic device according to claim 1, wherein said source and drain regions are disposed on a top surface of said self-assembled monolayer.

13. The electronic device according to claim 1, wherein said source and drain regions are each disposed on a side of said self-assembled molecular layer.

14. The electronic device according to claim 1, wherein one of said source and drain regions is disposed on a side of said self-assembled monolayer, and another of said source and drain regions is disposed on a top of said self-assembled monolayer.

15. The electronic device according to claim 1, wherein one of said source and drain regions is disposed on a bottom and side of said self-assembled monolayer, and another of said source and drain regions is disposed on a top and side of said self-assembled monolayer.

16. The electronic device according to claim 1, wherein said conjugated molecule comprises an oligophenylacethylene, a polyacene, an oligothiophene, a phenylene, a phenylene vinylene, and a porphyrin-derivative, or any combination thereof.

17. The electronic device according to claim 1, further comprising:
a gate electrode for controlling a channel region of said monolayer, said monolayer being formed between said conductive layer and said gate electrode.

18. The electronic device according to claim 1, wherein said monolayer comprises a channel region in which charges are transported by intermolecular hopping between adjacent conjugated molecules in said plurality of conjugated molecules.

19. The electronic device according to claim 1, wherein said plurality of conjugated molecules are oriented in a direction perpendicular to a surface of said conductive layer.

20. The electronic device according to claim 5, wherein said gate electrode comprises a same layer as said conductive layer, and
wherein said conductive layer assembles said self-assembled monolayer and controls an electrostatic function of said self-assembled monolayer.

21. The electronic device according to claim 20, wherein at least one of said gate electrode and said conductive layer are isolated electrically from said self-assembled monolayer.

22. The electronic device according to claim 6, wherein said plurality of molecules are aligned and packed together to form a two dimensional film.

23. The electronic device according to claim 8, further comprising:
an insulator formed on said monolayer,
wherein said self-assembled monolayer comprises an active layer in which current modulation and charge transport occur at an interface with said insulator.

24. The electronic device according to claim 9, wherein said self-assembled monolayer further comprises a second functional group which increases an electrical isolation between said self-assembled monolayer and an adjacent layer.

25. The electronic device according to claim 24, wherein said first and second linictional groups comprise at least one of phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amid, alcohol, selenol, nitra, boronic acid, ether, thioether, carbamate, thiocarbamate, dithiocarbamate, dithiocarboxylate, xanthate, thioxanthate, alkyithiophosphate, dialkylditbiophosphate, phosphonic acid, hydroxamic acid, and any combination of these groups.

26. The electronic device according to claim 12, wherein said conductive layer is disposed on a top surface of said self-assembled monolayer.

27. The electronic device according to claim 13, wherein said conductive layer is disposed on a top surface of said self-assembled monolayer.

28. The electronic device according to claim 17, further comprising:
an insulating layer formed between said self-assembled monolayer and said gate electrode.

29. An electronic device comprising:
a self-assembled monolayer in electronic interaction with a conductive layer, said monolayer comprising a plurality of conjugated molecules aligned on said conductive layer, and said conductive layer broadening an electronic state of said plurality of conjugated molecule;
a source electrode and a drain electrode formed adjacent to said self-assembled monolayer;
a dielectric layer fanned on said self assembled monolayer; and
a gate electrode formed on said dielectric layer.

30. An electronic device comprising:
an insulating layer formed on a semiconductor substrate;
a self-assembled monolayer formed on said insulating layer and comprising a conjugated molecule;
a source electrode and a drain electrode formed adjacent to said monolayer; and
a gate electrode formed on said monolayer for broadening an electronic state of said conjugated molecule.

* * * * *